United States Patent
Porrini et al.

(10) Patent No.: US 11,987,899 B2
(45) Date of Patent: May 21, 2024

(54) METHODS FOR PREPARING AN INGOT IN AN INGOT PULLER APPARATUS AND METHODS FOR SELECTING A SIDE HEATER LENGTH FOR SUCH APPARATUS

(71) Applicant: GlobalWafers Co., Ltd., Hsinchu (TW)

(72) Inventors: Maria Porrini, Merano (IT); Sergio Morelli, Merano (IT); Mauro Diodá, Merano (IT)

(73) Assignee: GlobalWafers Co., Ltd., Hsinchu (TW)

( * ) Notice: Subject to any disclaimer, the term of this patent is extended or adjusted under 35 U.S.C. 154(b) by 31 days.

(21) Appl. No.: 17/096,516

(22) Filed: Nov. 12, 2020

(65) Prior Publication Data

US 2022/0145490 A1 May 12, 2022

(51) Int. Cl.
*C30B 15/10* (2006.01)
*C30B 15/00* (2006.01)
*C30B 15/14* (2006.01)
*C30B 15/20* (2006.01)
*C30B 15/36* (2006.01)

(52) U.S. Cl.
CPC ............ *C30B 15/10* (2013.01); *C30B 15/007* (2013.01); *C30B 15/14* (2013.01); *C30B 15/20* (2013.01); *C30B 15/36* (2013.01)

(58) Field of Classification Search
CPC ......... C30B 29/06; C30B 15/20; C30B 15/14; C30B 35/00
See application file for complete search history.

(56) References Cited

U.S. PATENT DOCUMENTS

| | | | |
|---|---|---|---|
| 5,154,795 A * | 10/1992 | Ishida | ..................... C30B 29/42 117/15 |
| 6,093,913 A | 7/2000 | Schrenker et al. | |
| 6,285,011 B1 | 9/2001 | Cherko | |
| 6,503,322 B1 | 1/2003 | Schrenker et al. | |
| 2003/0024473 A1 | 2/2003 | Lu et al. | |
| 2004/0055527 A1 | 3/2004 | Kojima et al. | |
| 2004/0112277 A1 | 6/2004 | Kulkarni | |
| 2006/0005761 A1* | 1/2006 | Kulkarni | ................. C30B 15/22 117/14 |

(Continued)

FOREIGN PATENT DOCUMENTS

CN 205420598 U 8/2016
JP 10279382 A * 10/1998 ............. C30B 15/14

(Continued)

OTHER PUBLICATIONS

European Patent Office, English computer translation of JP2018188338. (Year: 2022).*

(Continued)

*Primary Examiner* — Matthew J Song
(74) *Attorney, Agent, or Firm* — Armstrong Teasdale LLP

(57) ABSTRACT

Methods for preparing an ingot in an ingot puller apparatus are disclosed. Thermal simulations are performed with the length of the ingot puller apparatus side heater being varied in the thermal simulations. A side heater is selected based on the thermal simulations. An ingot puller apparatus having the selected side heater length is provided. A seed crystal is lowered into a melt within a crucible of the ingot puller apparatus and an ingot is withdrawn from the melt.

20 Claims, 5 Drawing Sheets

(56) References Cited

U.S. PATENT DOCUMENTS

| | | | |
|---|---|---|---|
| 2008/0047485 A1* | 2/2008 | Cho | C30B 35/00 |
| | | | 117/15 |
| 2009/0272948 A1* | 11/2009 | Cho | C30B 15/14 |
| | | | 252/519.15 |
| 2010/0107966 A1* | 5/2010 | Javidi | C30B 15/00 |
| | | | 117/35 |
| 2013/0133567 A1 | 5/2013 | Bender | |
| 2016/0108551 A1* | 4/2016 | Basak | C30B 29/06 |
| | | | 117/28 |
| 2016/0201216 A1* | 7/2016 | Sudo | C03B 19/095 |
| | | | 117/208 |

FOREIGN PATENT DOCUMENTS

| | | | | |
|---|---|---|---|---|
| JP | 2018188338 A | * | 11/2018 | C30B 29/06 |
| KR | 100661054 B1 | | 12/2006 | |
| KR | 20070033516 A | | 3/2007 | |

OTHER PUBLICATIONS

English computer translation of JP-10279382 (Year: 2023).*
Zhou Bing et al, "Reduction of oxygen concentration by heater design during Czochralski Si growth", Journal of Crystal Growth, Elsevier, Amsterdam, NL, vol. 483, Nov. 7, 2017, pp. 164-168.

* cited by examiner

METHODS FOR PREPARING AN INGOT IN AN INGOT PULLER APPARATUS AND METHODS FOR SELECTING A SIDE HEATER LENGTH FOR SUCH APPARATUS

FIELD OF THE DISCLOSURE

The field of the disclosure relates to methods for preparing an ingot in an ingot puller apparatus and, in particular, methods for preparing an ingot that involve selecting an ingot puller apparatus side heater length for such apparatus.

BACKGROUND

Some conventional ingot puller apparatus include a relatively long side heater in the ingot puller hot zone. To achieve a desired temperature profile in the melt and reduce oxygen input into the melt, insulation is removed toward the bottom of the hot zone. Removal of insulation may reduce the temperature of the floor of the crucible which reduces dissolution of oxygen from the crucible into the melt. However, removal of insulation increases the side heater energy input thereby decreasing thermal efficiency. Further, relatively long heaters may heat the bottom of the crucible and the shaft used to raise the crucible when the crucible is raised during crystal growth further decreasing the energy efficiency of the process.

Other methods for reducing oxygen input from the crucible involve application of a magnetic field to the silicon melt during ingot growth to dampen the melt flows and transport of the oxygen-rich melt from the melt-crucible interface to the melt-ingot interface. Such methods may involve significant capital and increased operating cost for generating the magnetic field.

A need exists for methods for preparing an ingot that reduce oxygen input from the crucible, that are relative thermally efficient, and that may be applied to a variety of ingot puller hot zones.

This section is intended to introduce the reader to various aspects of art that may be related to various aspects of the disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

SUMMARY

One aspect of the present disclosure is directed to a method for preparing an ingot in an ingot puller apparatus. An ingot puller apparatus for preparing ingots is provided. The ingot puller apparatus includes a crucible for holding a melt of silicon. The crucible has a floor and a sidewall that extends from the floor. The ingot puller apparatus includes a growth chamber for pulling a silicon ingot from the melt along a pull axis. The ingot puller apparatus includes a lift mechanism for raising and lowering the crucible during crystal growth relative to the pull axis. The ingot puller apparatus includes a bottom heater disposed below the crucible floor. A length of a side heater disposed radially outward to the crucible sidewall is selected. Selecting the length of the side heater includes modeling a temperature profile of the crucible in the ingot puller apparatus while withdrawing an ingot from the silicon melt in two or more thermal simulations. The length of the side heater is varied during the thermal simulations. The length of the side heater is selected based on temperatures of the floor of the crucible during the two or more thermal simulations. A side heater disposed radially outward to the crucible sidewall is provided. The side heater has the selected side heater length. A melt of silicon is formed in the crucible. The melt is contacted with a seed crystal. An ingot is withdrawn from the silicon melt.

Yet another aspect of the present disclosure is directed to a method for selecting a side heater length in an ingot puller apparatus. The ingot puller apparatus includes a crucible for holding a melt of silicon. The crucible has a floor and a sidewall that extends from the floor. The temperature of the crucible during ingot growth in the ingot puller apparatus is thermally simulated with the ingot puller apparatus including a side heater having a first length. The temperature of a crucible during ingot growth in the ingot puller apparatus is thermally simulated with the ingot puller apparatus including a side heater having a second length. The temperature of the crucible during the thermal simulation in which the side heater has a first length and the temperature of the crucible during the thermal simulation in which the side heater has a second length are compared. A heater length is selected based on the comparison of the temperature of the crucible in the thermal simulation in which the side heater has a first length and the temperature of the crucible in the thermal simulation in which the side heater has a second length.

Various refinements exist of the features noted in relation to the above-mentioned aspects of the present disclosure. Further features may also be incorporated in the above-mentioned aspects of the present disclosure as well. These refinements and additional features may exist individually or in any combination. For instance, various features discussed below in relation to any of the illustrated embodiments of the present disclosure may be incorporated into any of the above-described aspects of the present disclosure, alone or in any combination.

BRIEF DESCRIPTION OF THE DRAWINGS

Corresponding reference characters indicate corresponding parts throughout the drawings.

DETAILED DESCRIPTION

Figure 1:
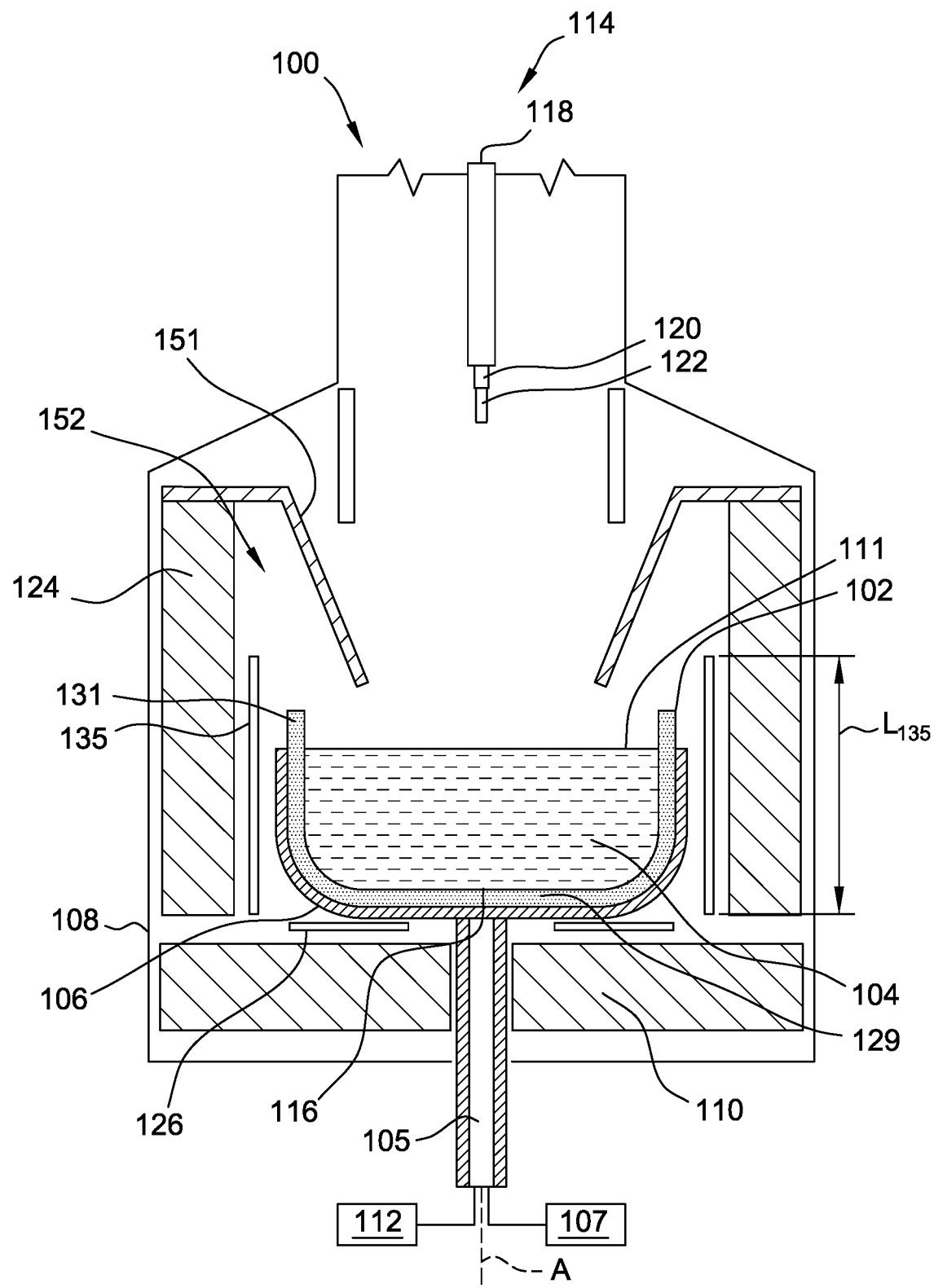
FIG. 1 is a cross-section view of an ingot puller apparatus with the crucible in the lowest position.

An ingot puller apparatus (or more simply "ingot puller") is indicated generally at "100" in FIG. 1. The ingot puller apparatus 100 includes a crucible 102 for holding a melt 104 of semiconductor or solar-grade material, such as silicon, supported by a susceptor 106. The ingot puller apparatus 100 includes a crystal puller housing 108 that defines a growth chamber 152 for pulling a silicon ingot 113 (FIG. 2) from the melt 104 along a pull axis A.

The crucible 102 includes a floor 129 and a sidewall 131 that extends upward from the floor 129. The sidewall 131 is generally vertical. The floor 129 includes the curved portion of the crucible 102 that extends below the sidewall 131. The crucible 102 includes a bottom 116 which is the lowest point of the crucible 102 relative to the pull axis A. Within the crucible 102 is a silicon melt 104 having a melt surface 111 (i.e., melt-ingot interface).

The susceptor 106 is supported by a shaft 105. The susceptor 106, crucible 102, shaft 105 and ingot 113 (FIG. 2) have a common longitudinal axis A or "pull axis" A.

A pulling mechanism 114 is provided within the ingot puller apparatus 100 for growing and pulling an ingot 113 from the melt 104. Pulling mechanism 114 includes a pulling cable 118, a seed holder or chuck 120 coupled to one end of the pulling cable 118, and a seed crystal 122 coupled to the seed holder or chuck 120 for initiating crystal growth. One end of the pulling cable 118 is connected to a pulley (not shown) or a drum (not shown), or any other suitable type of lifting mechanism, for example, a shaft, and the other end is connected to the chuck 120 that holds the seed crystal 122. In operation, the seed crystal 122 is lowered to contact the melt 104. The pulling mechanism 114 is operated to cause the seed crystal 122 to rise. This causes a single crystal ingot 113 (FIG. 2) to be pulled from the melt 104.

During heating and crystal pulling, a crucible drive unit 107 (e.g., a motor) rotates the crucible 102 and susceptor 106. A lift mechanism 112 raises and lowers the crucible 102 along the pull axis A during the growth process. For example, as shown in FIG. 1, the crucible may be at a lowest position (near the bottom heater 126) in which a charge of solid polycrystalline silicon previously added to the crucible 102 is melted. Crystal growth commences by contacting the melt 104 with the seed crystal 122 and lifting the seed crystal 122 by the pulling mechanism 114. The crucible 102 may be raised a distance from its lowest position before the melt 104 is contacted with the seed crystal 122 (i.e., raised to a "seed-dip position").

As the ingot grows, the silicon melt 104 is consumed and the height of the melt in the crucible 102 decreases. The crucible 102 and susceptor 106 may be raised to maintain the melt surface 111 at or near the same position relative to the ingot puller apparatus 100. The crucible 102 may move axially between its lowest position shown in FIG. 1 (e.g., at meltdown), to the seed-dip position at which a seed crystal is initially contacted with the melt to pull the silicon ingot from the melt, and a terminal position (FIG. 3) in which the crucible has been depleted of melt. The terminal position of the crucible 102 is above the seed-dip position of the crucible 102 (and lowest position).

A crystal drive unit (not shown) may also rotate the pulling cable 118 and ingot 113 (FIG. 2) in a direction opposite the direction in which the crucible drive unit 107 rotates the crucible 102 (e.g., counter-rotation). In embodiments using iso-rotation, the crystal drive unit may rotate the pulling cable 118 in the same direction in which crucible drive unit 107 rotates the crucible 102. In addition, the crystal drive unit 107 raises and lowers the ingot 113 relative to the melt surface 111 as desired during the growth process.

The ingot puller apparatus 100 may include an inert gas system to introduce and withdraw an inert gas such as argon from the growth chamber 152. The ingot puller apparatus 100 may also include a dopant feed system (not shown) for introducing dopant into the melt 104.

According to the Czochralski single crystal growth process, a quantity of polycrystalline silicon, or polysilicon, is charged to the crucible 102. The semiconductor or solar-grade material that is introduced into the crucible is melted by heat provided from one or more heating elements. The ingot puller apparatus 100 includes bottom insulation 110 and side insulation 124 to retain heat in the puller apparatus.

In the illustrated embodiment, the ingot puller apparatus 100 includes a bottom heater 126 disposed below the crucible floor 129. The crucible 102 may be moved to be in relatively close proximity to the bottom heater 126 to melt the polycrystalline charged to the crucible 102.

Figure 2:
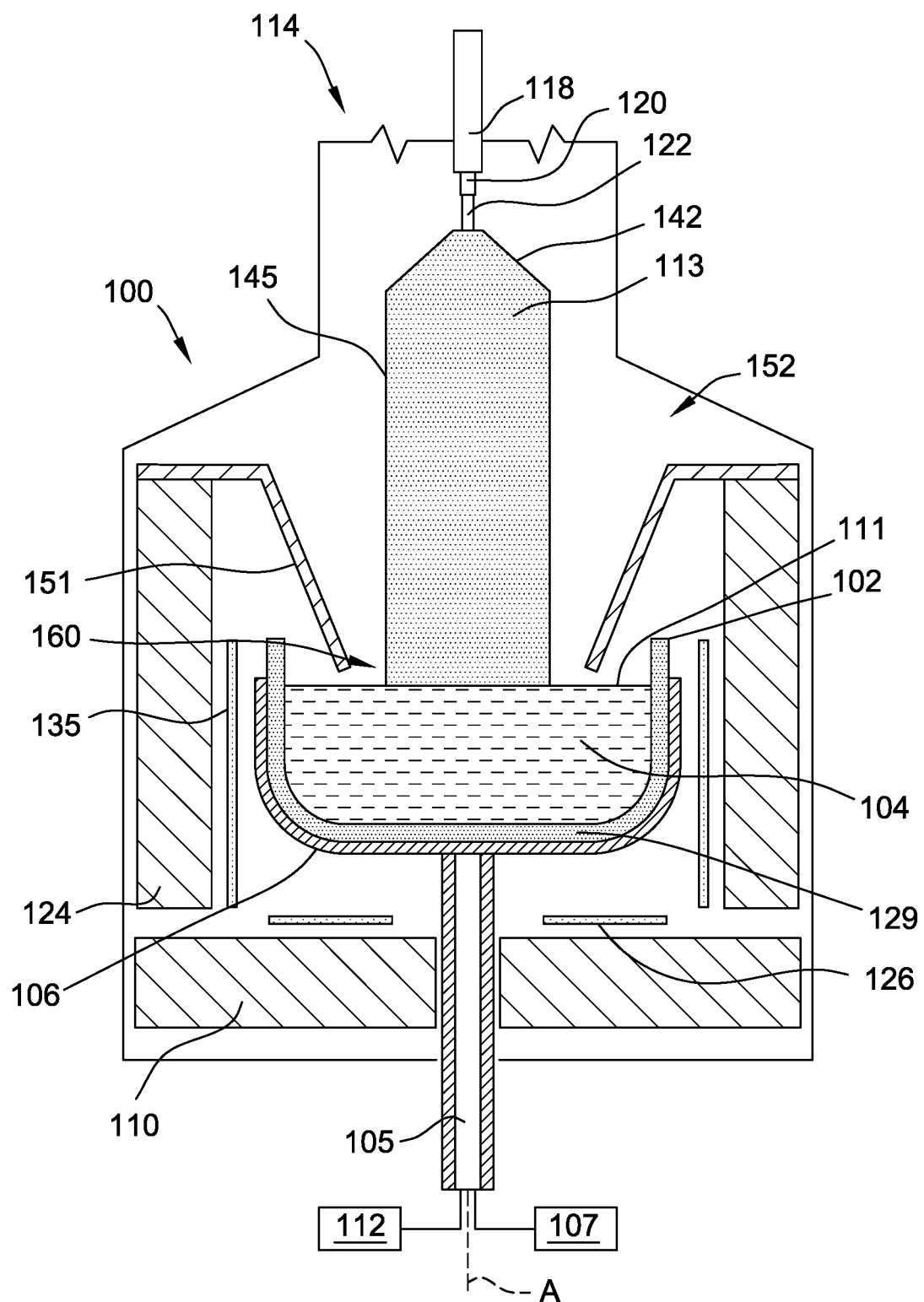
FIG. 2 is a cross-section view of the ingot puller apparatus during ingot growth.

To form the ingot, the seed crystal 122 is contacted with the surface 111 of the melt 104. The pulling mechanism 114 is operated to pull the seed crystal 122 from the melt 104. Referring now to FIG. 2, the ingot 113 includes a crown portion 142 in which the ingot transitions and tapers outward from the seed crystal 122 to reach a target diameter. The ingot 113 includes a constant diameter portion 145 or cylindrical "main body" of the crystal which is grown by increasing the pull rate. The main body 145 of the ingot 113 has a relatively constant diameter. The ingot 113 includes a tail or end-cone 149 (FIG. 3) in which the ingot tapers in diameter after the main body 145. When the diameter becomes small enough, the ingot 113 is then separated from the melt 104. The ingot 113 has a central longitudinal axis A that extends through the crown portion 142 and a terminal end 150 of the ingot 113.

The ingot puller apparatus 100 includes a side heater 135 and a susceptor 106 that encircles the crucible 102 to maintain the temperature of the melt 104 during crystal growth. The side heater 135 is disposed radially outward to the crucible sidewall 131 as the crucible 102 travels up and down the pull axis A (e.g., from the lowest position to the terminal position). The side heater 135 and bottom heater 126 may be any type of heater that allows the side heater 135 and bottom heater 126 to operate as described herein. In some embodiments, the heaters 135, 126 are resistance heaters. The side heater 135 and bottom heater 126 may be controlled by a control system (not shown) so that the temperature of the melt 104 is controlled throughout the pulling process.

Figure 3:
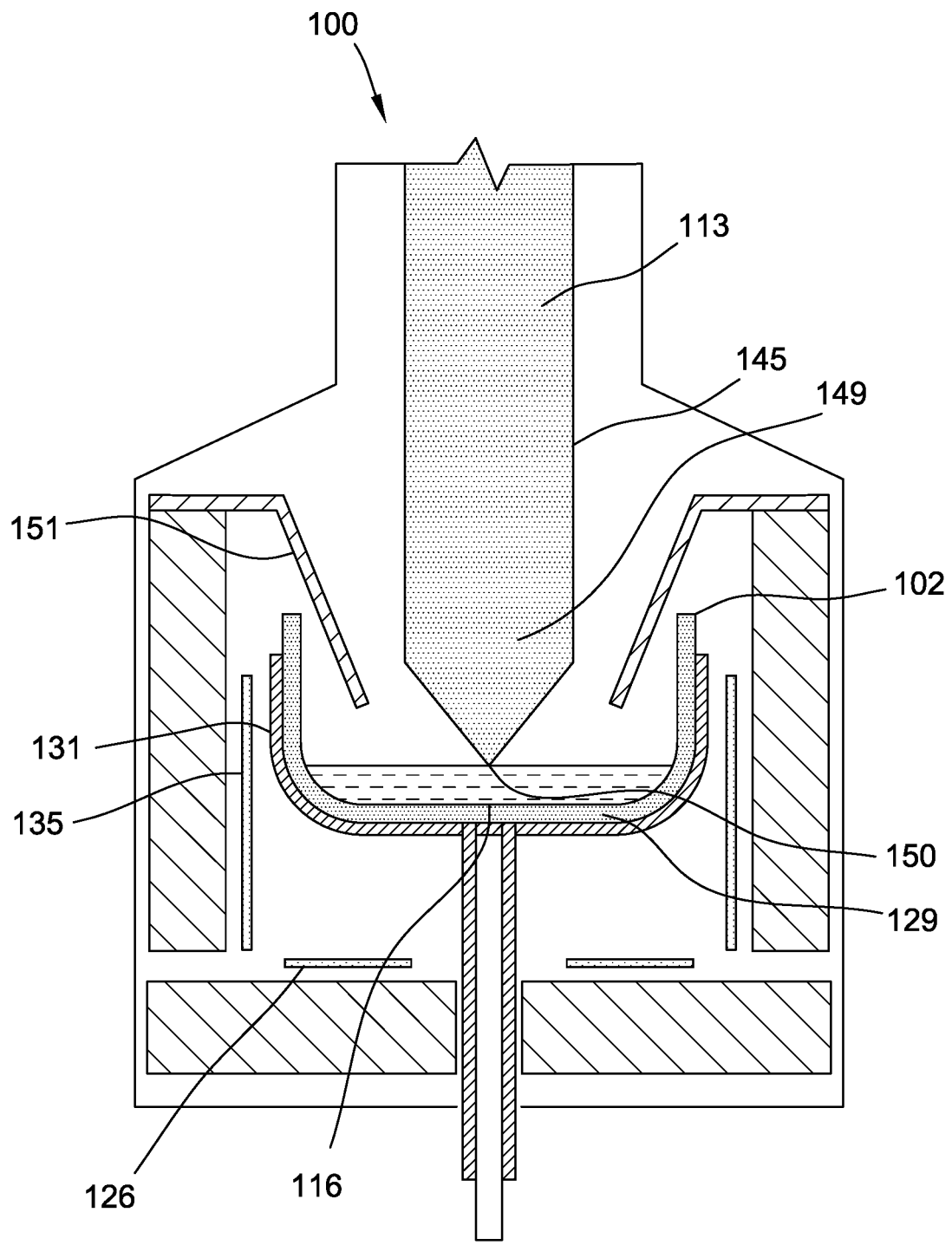
FIG. 3 is a cross-section view of the ingot puller apparatus with the crucible in a terminal position in which the melt is depleted.

The ingot puller apparatus 100 may include a heat shield 151. The heat shield 151 may shroud the ingot 113 such that the ingot 113 passes through an opening 160 formed by the heat shield 151. The heat shield 151 may be disposed within the crucible 102 during crystal growth (e.g., as shown in the terminal position of the crucible 102 as shown in FIG. 3). In some embodiments, the ingot crystal puller apparatus does not include a heat shield disposed below the side heater (e.g., disposed directly below the side heater).

In accordance with embodiments of the present disclosure for preparing an ingot 113 in the ingot puller apparatus 100, a length $L_{135}$ (FIG. 1) (i.e., height relative to pull axis A) of the side heater 135 is selected based on two or more thermal simulations of the ingot puller apparatus 100 (e.g., of the crucible 102). In some embodiments, the length $L_{135}$ of the heater 135 is selected and a side heater 135 with the selected length $L_{135}$ is provided in the ingot puller apparatus 100. An ingot 113 is then pulled from a melt 104 formed in the crucible 102 of the ingot puller apparatus 100.

To select a length $L_{135}$ of the side heater 135, the temperature profile of the crucible 102 in the ingot puller apparatus 100 is modeled while withdrawing an ingot 113 from the silicon melt 104 in two or more thermal simulations with the length $L_{135}$ of the side heater 135 being varied during the thermal simulations (e.g., as described in Example 1 below). The thermal simulations were performed using commercially available tools, such as CrysVun (CrysVun software, Crystal Growth Laboratory, Fraunhofer Institute IISB, Erlangen, Germany) and CGSim (CGSim software, commercialized by STR Group, Inc., St. Petersburg, Russia). These tools are exemplary and other software codes that model the heat transmission in a puller during the growth of a crystal may be used (e.g., any steady-state 2D simulation). The crucible temperature may also be measured experimentally by use of temperature sensors. In some embodiments, the temperature of the crucible floor 129 (e.g., any portion of the crucible that extends inward from the sidewall 131 including the curved portion) during one or more stages of ingot growth is modeled.

During the first thermal simulation, the side heater 135 is assigned a first length and, during the second thermal simulation, the side heater 135 is assigned a second length that is different from the first length. The side heater length that is used in the ingot puller apparatus 100 (i.e., the physical unit and not the modeled apparatus) may be selected from the first and second lengths. In some embodiments, additional thermal simulations are performed with the side heater length $L_{135}$ being varied during the simulations (e.g., three, four or five or more thermal simulations with different side heater lengths $L_{135}$ being used).

Once the thermal simulations have been performed, the length $L_{135}$ of the side heater 135 is selected based on the modeled temperatures of the crucible 102 (e.g., modeled temperature of the crucible floor 129) that resulted from the simulations. For example, the temperatures of the crucible 102 (e.g., crucible floor 129) during the simulations for each length $L_{135}$ of the side heater 135 that was modeled during the thermal simulations may be compared and/or subjected to various criterion to select the length $L_{135}$ of the side heater 135.

Generally any length $L_{135}$ of the side heater 135 may be selected based on the crucible temperature and the criterion set by the user. In some embodiments, the selected side heater length $L_{135}$ corresponds to the length used in a thermal simulation in which the floor of the crucible has a temperature of about 1490° C. or less as determined from the model or, as in other embodiments, 1482° C. or less or 1450° C. or less as determined from the model. In some embodiments, the selected side heater length $L_{135}$ corresponds to the length used in a thermal simulation in which the floor of the crucible has a temperature of about 1425° C. to about 1450° C. as determined by the model.

The selected side heater length $L_{135}$ may also be selected to minimize changes to the radial gradient at the melt surface 111 so as to reduce (or eliminate) loss of zero dislocation in the ingot and to minimize point defects in the ingot (e.g., such as by maintaining sufficient heat and temperature at a height near the top of the crucible).

The selected length $L_{135}$ may be different for different types of hot zone configurations. In some embodiments, the selected length $L_{135}$ of the side heater 135 is less than about 550 mm, less than about 525 mm, less than 500 mm, less than 475 mm or less than 450 mm (e.g., 350 mm to about 500 mm or 350 mm to about 450 mm).

Once the side heater length $L_{135}$ has been selected, a side heater 135 having the selected length $L_{135}$ is provided in the ingot puller apparatus 100. The ingot puller apparatus 100 may then be used to prepare a silicon ingot. As discussed further above, a melt 104 of silicon (FIG. 1) is prepared in the crucible 102 of the ingot puller apparatus 100 having a side heater 135. The melt 104 is contacted with a seed crystal 122 and the seed crystal 122 and ingot 113 attached to the seed crystal 122 are withdrawn from the melt 104.

In accordance with embodiments of the present disclosure, the side heater 135 may have a relatively shorter length $L_{135}$ relative to conventional ingot crystal pullers which may reduce the amount of oxygen taken up in the ingot 113. In some embodiments, the side heater 135 may have a length $L_{135}$ of no more than about 550 mm (e.g., less than about 525 mm, less than 500 mm, less than 475 mm, less than 450 mm, 350 mm to about 500 mm or 350 mm to about 450 mm).

Methods of embodiments of the present disclosure have several advantages over conventional ingot puller apparatus. By thermally simulating the temperature of the crucible (e.g., crucible floor) to select a side heater length for use in the ingot puller apparatus, the amount of oxygen taken up by the ingot during ingot growth may be reduced. By reducing the length of the side heater by use of thermal simulations, the crucible floor temperature may be reduced (e.g., to less than the crucible sidewall but above the freezing point of silicon) without increasing energy consumption. Lowering the temperature of the crucible floor reduces the contribution of oxygen into the melt from the crucible by reducing crucible dissolution and by reducing convective transport of the oxygen-rich melt from the crucible floor to the melt-ingot interface. Reducing oxygen in the ingot reduces thermal donors in the ingot which facilitates production of relatively high resistivity silicon having a more consistent resistivity (e.g., from ingot to ingot and axially within an ingot). In some embodiments, the methods of the present disclosure may allow wafers having a concentration of less than 8 ppma, less than 6 ppma or even less than 4 ppma to be achieved. Reducing side heater length may also increase the temperature of the crucible near the top of the sidewall which may reduce condensation of gaseous oxides on the crucible wall. Such condensed oxides may detach and fall into the melt causing loss of monocrystalline structure. Increasing the temperature of the crucible near the top also increases the radial thermal gradient in the melt which reduces nucleating solid silicon (i.e., "icing") at the crucible wall. Increasing the temperature of the crucible near the top also increases the radial thermal gradient in the melt which reduces the risk of rod distortion (i.e., the propensity of the crystal to show deviations from cylindricity). The thermal simulations for determining side heater length are generally compatible with most hot zone configurations.

EXAMPLES

The methods of the present disclosure are further illustrated by the following Examples. These Examples should not be viewed in a limiting sense.

Example 1

Thermal Simulations Performed with Different Side Heater Lengths

Figure 4:
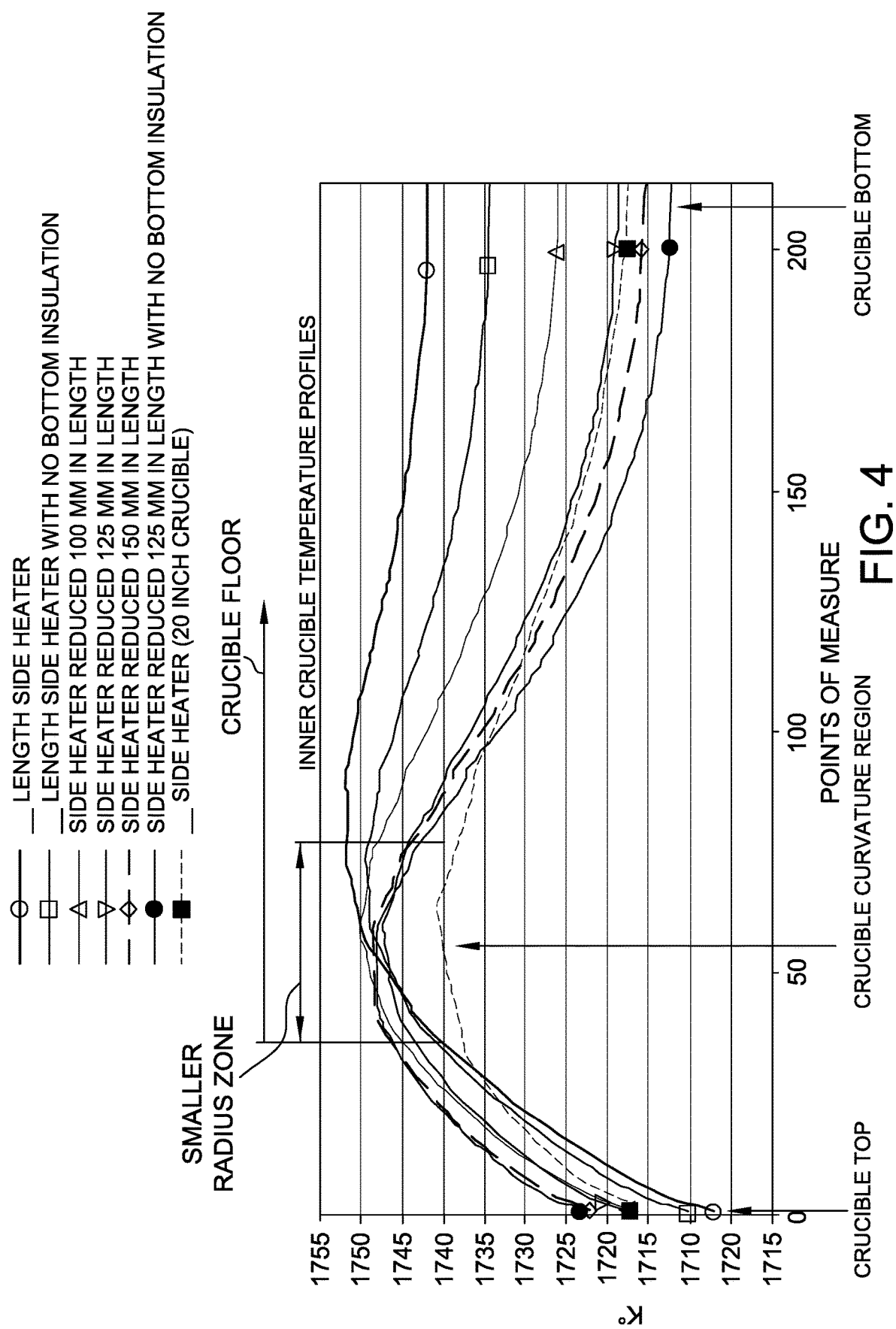
FIG. 4 is a graph showing the crucible wall temperature for the thermal simulations of Example 1.

FIG. 4 shows thermal simulations for an ingot puller hot zone similar to the hot zone of the ingot puller apparatus of FIGS. 1-3 normalized along its length ("0" being the bottom and "200" the top). The ingot puller apparatus was a 24 inch puller and included a magnet in a cusp configuration that was capable of generating a magnetic field of several hundred gauss. The thermal simulations include a side heater with a length of 550 mm. One thermal simulation included the same ingot puller apparatus (i.e., same side heater length) but with the side heater bottom insulation removed. Other thermal simulations include the same ingot puller apparatus with the side heater length reduced by 100 mm, 125 mm and 150 mm. Yet another simulation included a side heater reduced by 125 mm in length with bottom insulation removed. One simulation includes a smaller hot zone ("20") for comparison.

In accordance with embodiments of the present disclosure, a heater length may be selected based on the thermal simulations shown in FIG. 4. As shown in FIG. 4, an ingot puller apparatus may be selected which reduces the crucible floor temperature up to 40° C. or more (e.g., by selecting a side heater length reduced by 150 mm). Use of a reduced length side heater also increases the temperature toward the top of the crucible (left-hand side of plot). Thermal simulations estimate a 2% energy reduction in power when the side heater height is reduced by 125 mm.

Example 2

Comparison of Oxygen Content when Side Heater Length is Reduced

Figure 5:
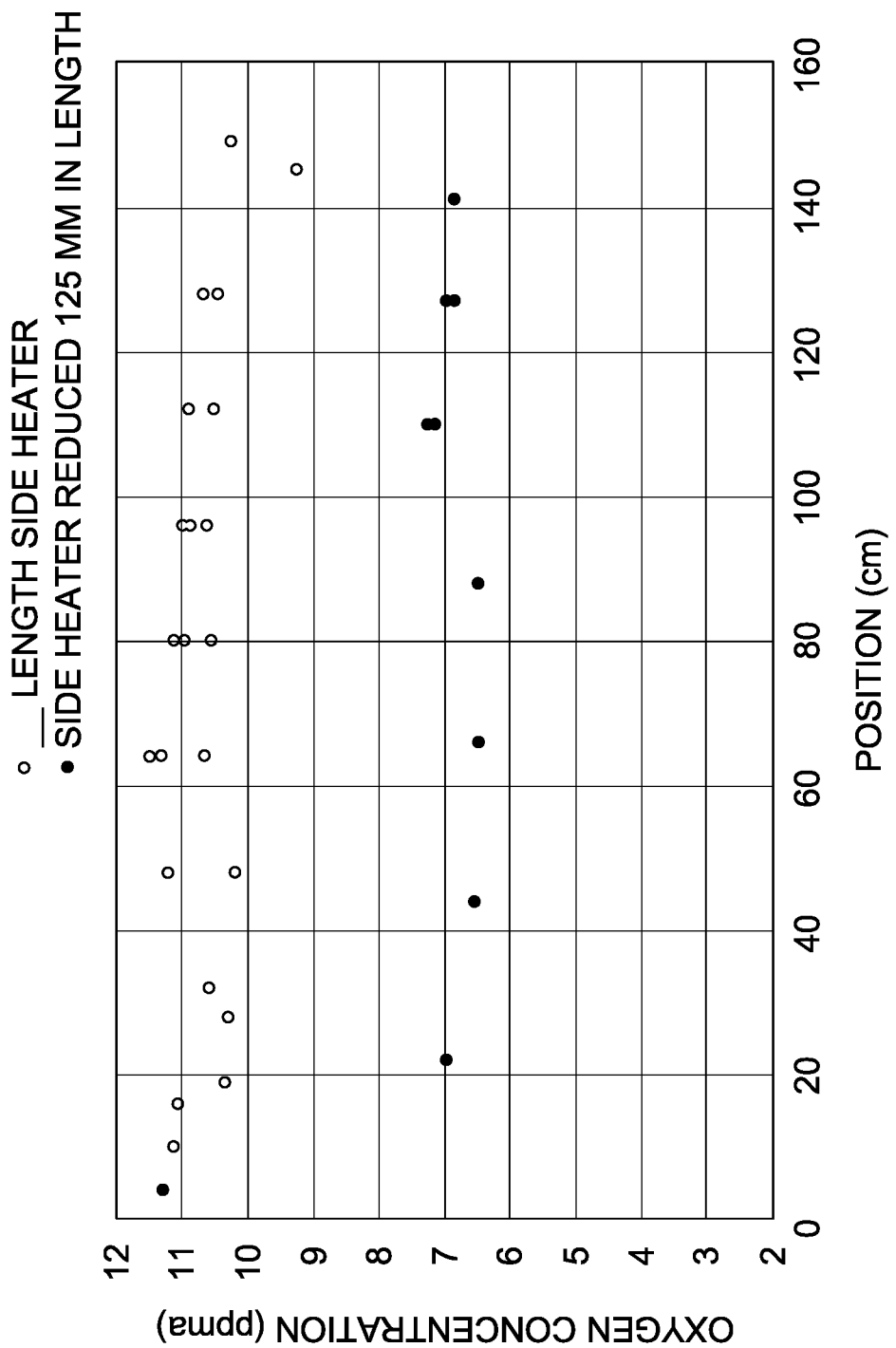
FIG. 5 is a graph of the axial oxygen profiles of ingots preparing in accordance with Example 2.

An ingot was prepared in the ingot puller apparatus having a side heater with a length of 550 mm from Example 1. Another ingot was prepared in an ingot puller apparatus having a side heater length reduced by 125 mm. The axial oxygen profiles of both ingots were measured and are shown in FIG. 5. As shown in FIG. 5, the oxygen concentration was reduced from about 11 ppma to about 6-7 ppma by decreasing the heater length by 125 mm. The power consumed in the two ingot puller apparatus was substantially the same.

As used herein, the terms "about," "substantially," "essentially" and "approximately" when used in conjunction with ranges of dimensions, concentrations, temperatures or other physical or chemical properties or characteristics is meant to cover variations that may exist in the upper and/or lower limits of the ranges of the properties or characteristics, including, for example, variations resulting from rounding, measurement methodology or other statistical variation.

When introducing elements of the present disclosure or the embodiment(s) thereof, the articles "a", "an", "the" and "said" are intended to mean that there are one or more of the elements. The terms "comprising," "including," "containing" and "having" are intended to be inclusive and mean that there may be additional elements other than the listed elements. The use of terms indicating a particular orientation (e.g., "top", "bottom", "side", etc.) is for convenience of description and does not require any particular orientation of the item described.

As various changes could be made in the above constructions and methods without departing from the scope of the disclosure, it is intended that all matter contained in the above description and shown in the accompanying drawing[s] shall be interpreted as illustrative and not in a limiting sense.

What is claimed is:

1. A method for preparing an ingot in an ingot puller apparatus, the method comprising:
   providing an ingot puller apparatus for preparing ingots comprising:
      a crucible for holding a melt of silicon, the crucible having a floor and a sidewall that extends from the floor, the crucible having a top, the floor comprising a curved portion;
      a growth chamber for pulling a silicon ingot from the melt along a pull axis;
      a lift mechanism for raising and lowering the crucible during crystal growth relative to the pull axis;
      a heat shield having an opening through which the ingot passes during crystal growth, the heat shield being disposed above the crucible; and
      a bottom heater disposed below the crucible floor;
   selecting a length of a side heater disposed radially outward to the crucible sidewall, selecting the length of the side heater comprising:
      modeling a temperature profile of the crucible in the ingot puller apparatus including the heat shield while withdrawing an ingot from the silicon melt in two or more thermal simulations, the length of the side heater being varied during the thermal simulations;
      selecting the length of the side heater based on temperatures of the floor of the crucible during the two or more thermal simulations, wherein the length of the side heater is selected based on the length of the side heater during a thermal simulation in which a portion of the floor of the crucible has a temperature of about 1450° C. or less and the top of the crucible has a temperature of at least 1715° K, the crucible having a maximum temperature, the maximum temperature being within the curved portion of the crucible and being at least 1740° K;
   providing a side heater disposed radially outward to the crucible sidewall, the side heater having the selected side heater length;
   forming a melt of silicon in the crucible;
   contacting the melt with a seed crystal; and
   withdrawing an ingot from the silicon melt.

2. The method as set forth in claim 1 wherein the length of the side heater is selected based on the length of the side heater during a thermal simulation in which the floor of the crucible has a temperature of about 1425° C. to about 1450° C.

3. The method as set forth in claim 1 wherein the selected length of the side heater is less than about 550 mm.

4. The method as set forth in claim 1 wherein the selected length of the side heater is less than about 500 mm.

5. The method as set forth in claim 1 wherein the selected length of the side heater is less than about 450 mm.

6. The method as set forth in claim 1 wherein the floor has a bottom that is the lowest point of the crucible relative to the pull axis, the length of the side heater being selected based on the length of the side heater during a thermal simulation in which the bottom of the crucible has a temperature of about 1450° C. or less.

7. The method as set forth in claim 1 wherein thermally simulating the temperature of a crucible comprises thermally simulating under a cusp magnetic field.

8. The method as set forth in claim 1 wherein the maximum temperature within the curved portion of the floor is at least 1745° K.

9. A method for selecting a side heater length in an ingot puller apparatus, the ingot puller apparatus comprising a crucible for holding a melt of silicon, the crucible having a floor and a sidewall that extends from the floor, the crucible having a top, the floor comprising a curved portion, the method comprising:
   thermally simulating the temperature of the crucible during ingot growth in the ingot puller apparatus, the ingot puller apparatus comprising a side heater having a first length;
   thermally simulating the temperature of a crucible during ingot growth in the ingot puller apparatus, the ingot puller apparatus comprising a side heater having a second length;
   comparing the temperature of the crucible during the thermal simulation in which the side heater has the first length and the temperature of the crucible during the thermal simulation in which the side heater has the second length; and
   selecting a heater length based on the comparison of the temperature of the crucible in the thermal simulation in which the side heater has the first length and the temperature of the crucible in the thermal simulation in which the side heater has the second length, wherein the length of the side heater is selected based on the length of the side heater during a thermal simulation in which a portion of the floor of the crucible has a temperature of about 1450° C. or less and the top of the crucible has a temperature of at least 1715° K, the crucible having a maximum temperature, the maximum temperature being within the curved portion of the crucible and being at least 1740° K.

10. The method as set forth in claim 9 wherein the temperature of the crucible floor during the thermal simulation in which the side heater has the first length and the temperature of the crucible floor during the thermal simulation in which the side heater has the second length are compared.

11. The method as set forth in claim 9 further comprising:
performing three, four or five or more thermal simulations with side heaters at different lengths;
comparing the temperature of the crucible in the thermal simulations; and
selecting a length of the side heater based on the comparison of the temperatures of the crucible in the thermal simulations.

12. The method as set forth in claim 11 wherein comparing the temperature of the crucible in the thermal simulations comprises comparing the temperature of the crucible floor in the thermal simulations.

13. The method as set forth in claim 9 wherein the length of the side heater is selected based on the length of the side heater during a thermal simulation in which the floor of the crucible has a temperature of about 1425° C. to about 1450° C.

14. The method as set forth in claim 9 wherein the selected length of the side heater is less than about 550 mm.

15. The method as set forth in claim 9 wherein the selected length of the side heater is less than about 500 mm.

16. The method as set forth in claim 9 wherein the selected length of the side heater is less than about 450 mm.

17. The method as set forth in claim 9 wherein the floor has a bottom that is the lowest point of the crucible relative to a pull axis of the ingot puller apparatus, the length of the side heater being selected based on the length of the side heater during a thermal simulation in which the bottom of the crucible has a temperature of about 1450° C. or less.

18. The method as set forth in claim 9 wherein thermally simulating the temperature of a crucible comprises thermally simulating the temperature with a cusp magnetic field being applied to the melt.

19. The method as set forth in claim 9 wherein the maximum temperature within the curved portion of the floor is at least 1745° K.

20. The method as set forth in claim 9 wherein the ingot puller apparatus comprises a heat shield having an opening through which the ingot passes during crystal growth, the heat shield being disposed above the crucible.

* * * * *